US010734992B2

(12) United States Patent
Vocurek et al.

(10) Patent No.: US 10,734,992 B2
(45) Date of Patent: Aug. 4, 2020

(54) CIRCUIT AND METHOD FOR PROVIDING AN OUTPUT SIGNAL

(71) Applicant: Infineon Technologies AG, Neubiberg (DE)

(72) Inventors: Dragos Vocurek, Bucharest (RO); Mario Motz, Wernberg (AT); Gabriel Bonteanu, Lasi (RO)

(73) Assignee: Infineon Technologies AG, Neubiberg (DE)

( * ) Notice: Subject to any disclaimer, the term of this patent is extended or adjusted under 35 U.S.C. 154(b) by 436 days.

(21) Appl. No.: 15/672,855

(22) Filed: Aug. 9, 2017

(65) Prior Publication Data
US 2019/0052260 A1 Feb. 14, 2019

(51) Int. Cl.
| | | |
|---|---|---|
| *H03K 17/16* | (2006.01) | |
| *G05F 3/02* | (2006.01) | |
| *H03K 17/693* | (2006.01) | |
| *H03K 17/22* | (2006.01) | |
| *H03K 19/003* | (2006.01) | |

(52) U.S. Cl.
CPC ............. *H03K 17/164* (2013.01); *G05F 3/02* (2013.01); *H03K 17/223* (2013.01); *H03K 17/693* (2013.01); *H03K 19/00361* (2013.01)

(58) Field of Classification Search
CPC .. H03K 17/164; H03K 17/223; H03K 17/693; H03K 19/00361; G05F 3/02

USPC .......................................................... 361/56
See application file for complete search history.

(56) References Cited

U.S. PATENT DOCUMENTS

| | | | | | |
|---|---|---|---|---|---|
| 5,563,759 | A | * | 10/1996 | Nadd ................. | H03K 17/0828 361/101 |
| 6,205,010 | B1 | * | 3/2001 | Ohsaka .............. | H03K 17/0822 361/103 |
| 6,236,252 | B1 | * | 5/2001 | Genest .................... | G05F 3/262 327/108 |
| 2008/0174184 | A1 | * | 7/2008 | Arpilliere ............... | H02M 1/08 307/125 |
| 2014/0312963 | A1 | * | 10/2014 | Berkhout ................ | G05F 3/262 327/543 |
| 2015/0098160 | A1 | * | 4/2015 | Gao .................... | H03K 17/0822 361/86 |
| 2019/0036520 | A1 | * | 1/2019 | Luo ....................... | H03K 17/693 |

* cited by examiner

*Primary Examiner* — Kevin J Comber
(74) *Attorney, Agent, or Firm* — Schiff Hardin LLP

(57) ABSTRACT

An output circuit including an output transistor configured to provide an output signal; and a gate switch configured to decouple a gate of the output transistor from other components of the output circuit when there is a decrease in a supply voltage of the output circuit, wherein when the gate of the output transistor is decoupled, a charge at the gate is maintained in a capacitor inherent within the gate of the output transistor.

18 Claims, 6 Drawing Sheets

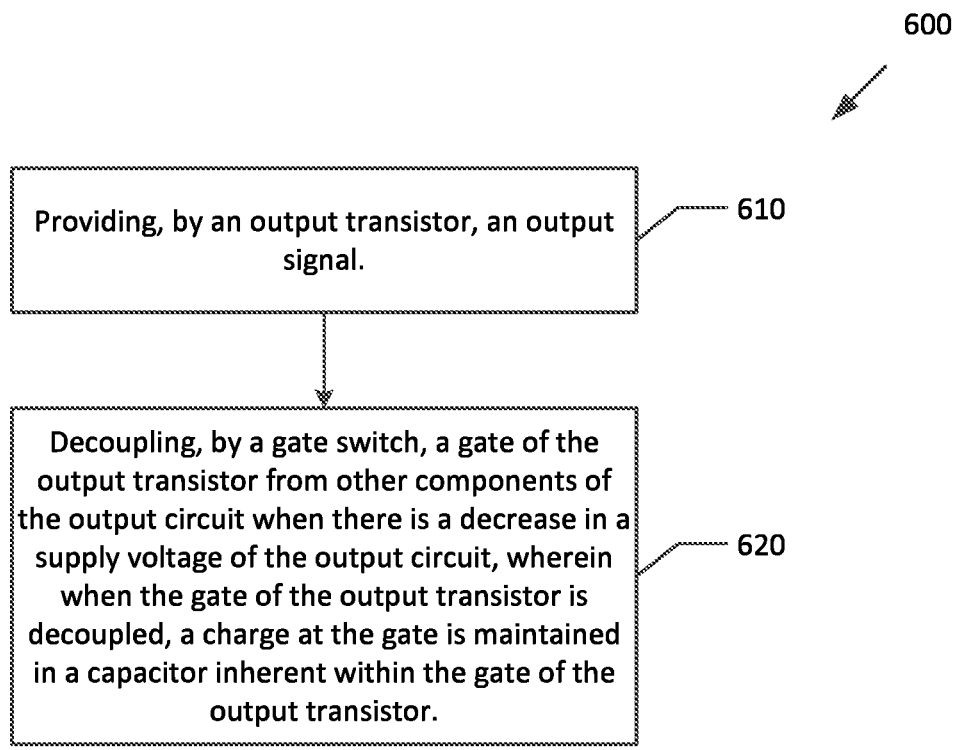

CIRCUIT AND METHOD FOR PROVIDING AN OUTPUT SIGNAL

BACKGROUND

The present disclosure is directed to enhancing Electro-Magnetic Compatibility (EMC) robustness of a 3-wire sensor output signal. Class A functionality on the output is ensured when the Integrated Circuit (IC) is exposed to either conducted or coupled pulses on the supply (e.g., Direct Capacitive Coupling (DCC)), inductive transients (e.g., Radio frequency Immunity (RI 130)), or short supply drops below a reset level.

One approach for enhancing EMC robustness uses an external storage capacitor, which supplies the IC during EMC pulses. A drawback of this approach is that it requires an extra bond pad and external passive component.

Another approach uses a relatively large integrated capacitor to supply output circuitry. Power management loss circuitry detects a supply voltage drop and outputs a hold signal to control the logic circuitry. During a power loss, the capacitor is decoupled from the supply line using a diode/switch, and a voltage stored on the capacitor supplies the output circuitry. A drawback of this approach is that it requires a relatively large integrated capacitor to supply all of the output circuitry. This drawback becomes even more significant at higher temperatures when additional leakage leads to a relatively quick loss of the stored voltage, which determines a significant drift of output sensor parameters, such as the output voltage saturation. Additionally, using a large capacitor to ensure good behavior at high temperatures results in slow discharging of the capacitor at lower temperatures when the power is switched off.

BRIEF DESCRIPTION OF THE DRAWINGS

FIG. 6 illustrates a flowchart of a method in accordance with aspects of the disclosure.

DETAILED DESCRIPTION

The present disclosure is directed to an output circuit including an output transistor configured to provide an output signal, and a gate switch configured to decouple the gate of the output transistor from other components of the output circuit when there is a decrease in a supply voltage of the output circuit. When the gate of the output transistor is decoupled, a charge at the gate is maintained in a capacitor inherent within the gate of the output transistor. The output circuit thus disconnects the gate of the output transistor, thereby ensuring a low leakage path.

Further, a charge pump may provide a voltage to the gate switch such that the gate switch need only be a small switch with low leakage. In addition, a reset controller may provide a defined time to reset the state of the output signal, independent of temperature.

Figure 1:
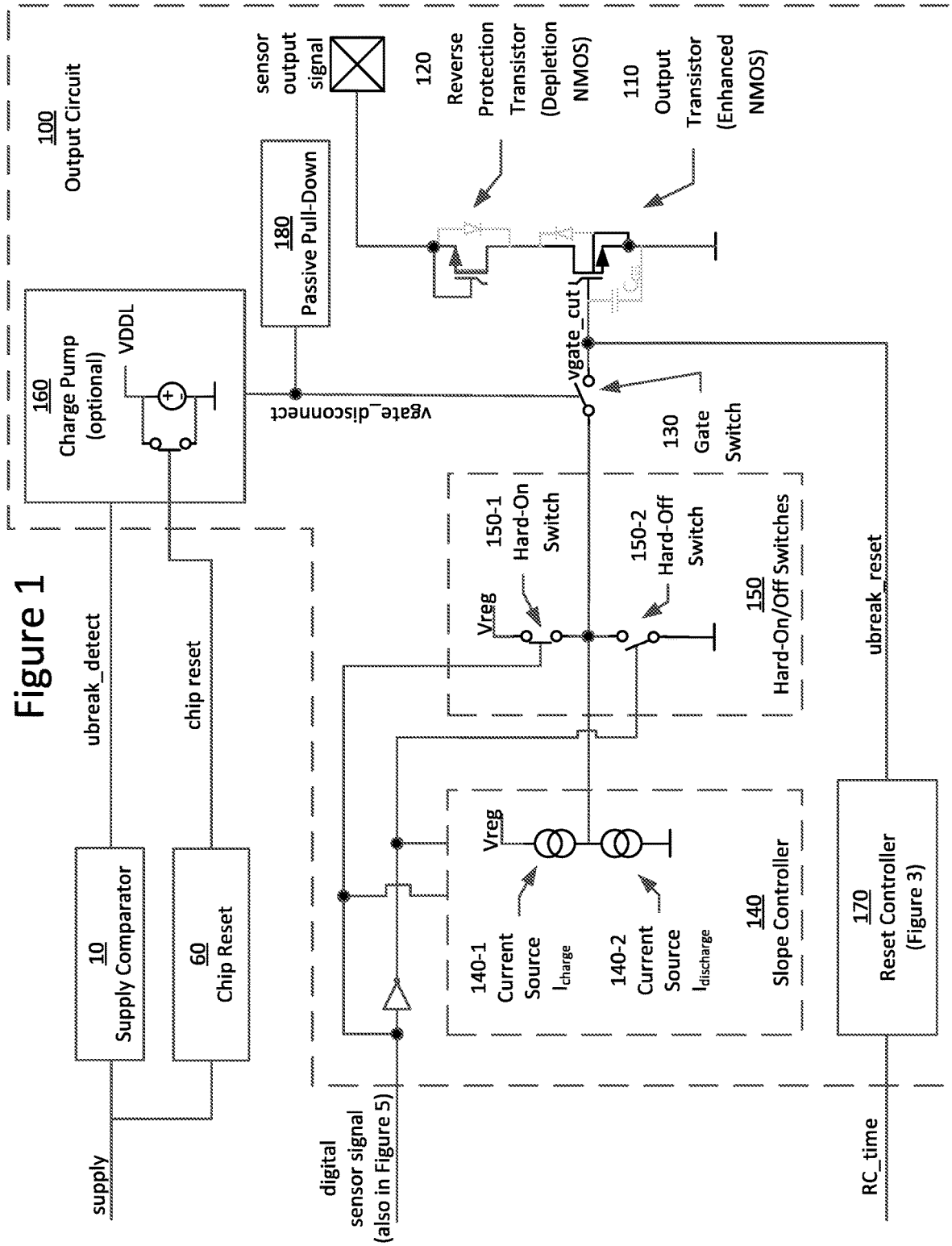
FIG. 1 illustrates a sensor output circuit for enhanced Electro-Magnetic Compatibility (EMC) robustness in accordance with aspects of the disclosure.

FIG. 1 illustrates an output circuit 100 for enhanced Electro-Magnetic Compatibility (EMC) robustness in accordance with aspects of the disclosure.

A sensor, such as a camshaft magnetic sensor, has three pins—supply, ground, and output. An output signal at the output pin is high or low depending on a magnetic signal applied to the sensor. During an EMC disturbance, the sensor output circuit 100 disconnects a gate of an output transistor 110, thereby providing a freezing output. An EMC disturbance is sometimes referred to herein as a "microbreak". A "freezing output" is when a state of the output signal is held for a period of time following a decrease in supply voltage caused by an EMC disturbance.

The output circuit 100 is configured to receive an input and output the output signal. The input and output signals may be of a sensor, though the disclosure is not limited in this respect.

The output circuit 100 comprises an output transistor 110, a reverse protection transistor 120, a gate switch 130, a slope controller 140, hard-on/off switches 150, a charge pump 160, a reset controller 170, and a passive pull-down circuit 180.

To place the sensor output circuit 100 in context, FIG. 1 shows a supply comparator 10 and a chip reset circuit 60. The supply comparator 10 is configured to detect when a supply voltage decreases below a predefined threshold, and output a microbreak detect signal to decouple the gate of the output transistor 110 from the rest of the circuitry. The chip reset 60 is configured to reset the charge pump 160.

The output transistor 110 is configured to provide the output signal. Turning the output transistor 110 to an on state results in the sensor output signal being low because the sensor output is coupled to ground. Turning the output transistor 110 to an off state results in the sensor output signal being high because the sensor output is decoupled from ground.

The output transistor 110 has an inherent storage capacitor Cis between its gate and source. Normally this inherent capacitor Cis is not wanted. However, during the microbreak, the sensor output state is stored in this inherent capacitor Cis. This is in contrast to prior solutions where the sensor output state is stored in a separate capacitor coupled in parallel with the output transistor 110. Since the output circuit 100 of this disclosure uses the inherent capacitor, no separate capacitor is needed.

The reverse protection transistor 120 is coupled between an output node of the output circuit 100 and the output transistor 110, and is configured to prevent a reverse current. More specifically, the reverse protection transistor 120 prevents large output currents in a case of a negative voltage at the sensor output by preventing a large current flow to the drain of the output transistor 110. The reverse current may be limited to be in a range of, for example, mA to prevent any harmful effects.

The output transistor 110 and the reverse protection transistor 120 are coupled anti-serially. In the exemplary implementation, the output transistor 110 is an NMOS transistor enhancement type, so is switched on with a positive gate voltage, and the reverse protection transistor 120 is NMOS depletion type, so is on all of the time, though the disclosure is not limited to this particular design.

The gate switch 130 is configured to decouple the gate of the output transistor 110 from other components of the output circuit 100 when there is a decrease in supply voltage of the output circuit 100. These other components are the components in the figure located to the left of the gate switch 130, that is, the slope controller 140 and the hard-on/off switches 150. When the gate of the output transistor 110 is decoupled, a charge at the gate is maintained in the capacitor Cis inherent within the gate of the output transistor 110.

The slope controller 140 is coupled between a signal input (digital sensor signal) of the output circuit 100 and the gate of the output transistor 110, and is configured to ensure controlled current charging and discharging of the gate of the output transistor 110. The slope controller 140 comprises a first current source 140-1 and a second current source 140-2. The first current source is 140-1 coupled between a supply $V_{reg}$ and the gate, and is configured to current charge the gate when the signal input to the output circuit is high. The second current is 140-2 source is coupled between the ground and the gate, and is configured to current discharge the gate when the signal input to the output circuit is low.

The hard-on/off switch circuit 150 is configured to ensure higher robustness of the output state during low-energy fast pulses (e.g., DCC) by providing a low ohmic path to the supply lines. The hard-on/off switch circuit 150 comprises a hard-on switch 150-1 and a hard-off switch 150-2. The hard-on switch 150-1 is coupled between the supply $V_{reg}$ and the gate, and is configured to be closed when a signal input to the output circuit is high. The hard-off switch 150-2 is coupled between the ground and the gate, and configured to be closed when the signal input to the output circuit is low.

The charge pump 160 is configured to provide a local supply voltage VDDL for controlling the gate switch 130 during a normal operation mode. The local supply voltage VDDL is greater than the supply voltage of the output circuit 100. The charge pump 160 is configured to increase the voltage level on the gate switch 130 in order to minimize the size and therefore leakage of the output switch 130. In order to have low on resistance (Ron) and low leakage on the gate switch 130, the driving signal of the switch is increased by the charge pump 160.

The reset controller 170 is coupled to the gate of the output transistor 110. When there is a decrease in the supply voltage (i.e., a microbreak), the reset controller 170 is configured to reset the output signal after a predetermined reset time has elapsed after the gate switch 130 decouples the gate of the output transistor 110. More specifically, the reset controller 170 is configured to output a reset signal, in response to receiving a resistor-capacitor (RC) time signal, to pull down the gate of the output transistor 110 after a predetermined reset time has elapsed. If there were only the gate switch 130 without the reset controller 170, there would be different behaviors at different temperatures because of leakage, which can discharge the gate of the output transistor 110 and cause the state of the output signal to go high. A worst case is at high temperature. At room temperature there is a relatively small leakage. The reset time, which is provided by an RC time constant of the RC time signal, should be independent of the temperature.

The passive pull-down circuit 180 is coupled to the gate switch 130, and is configured to drive the gate switch 130 to ground during the decrease in the supply voltage.

During normal operation when there is a high enough supply voltage, the charge pump 160 is on, providing a higher voltage than the supply voltage. The provided voltage may be double the supply voltage, for example.

In case of a supply voltage decrease, the supply comparator 10 detects the microbreak and outputs the microbreak detect signal. This microbreak detect signal is transmitted through a level shifter within the charge pump 160 to switch off the gate switch 130. In this way, the gate of the output transistor 110 is isolated from the rest of the circuitry (e.g., hard-on/off switches 150 and slope controller 140). The chip reset signal transmitted by the chip reset circuit 60 switches off the clock signals delivered to the charge pump and discharges the charge pump output capacitor. The passive pull-down circuit 180 combined with the small size of the gate switch 130 having low leakage maintains the output voltage level for a duration of, for example, up to 100 us. The freezing output is temperature dependent, that is, a duration of approximately 100 us may be seconds or minutes at lower temperatures due to the exponential characteristic of the leakage. The reset controller 170 provides a maximum reset time of the freezing state. Based on this feature, a freezing output is ensured to be maintained despite the temperature value. Even at lower temperatures, a reset is triggered in the hundreds of microseconds range, which provides a predictable behavior of the integrated circuit.

Figure 2:
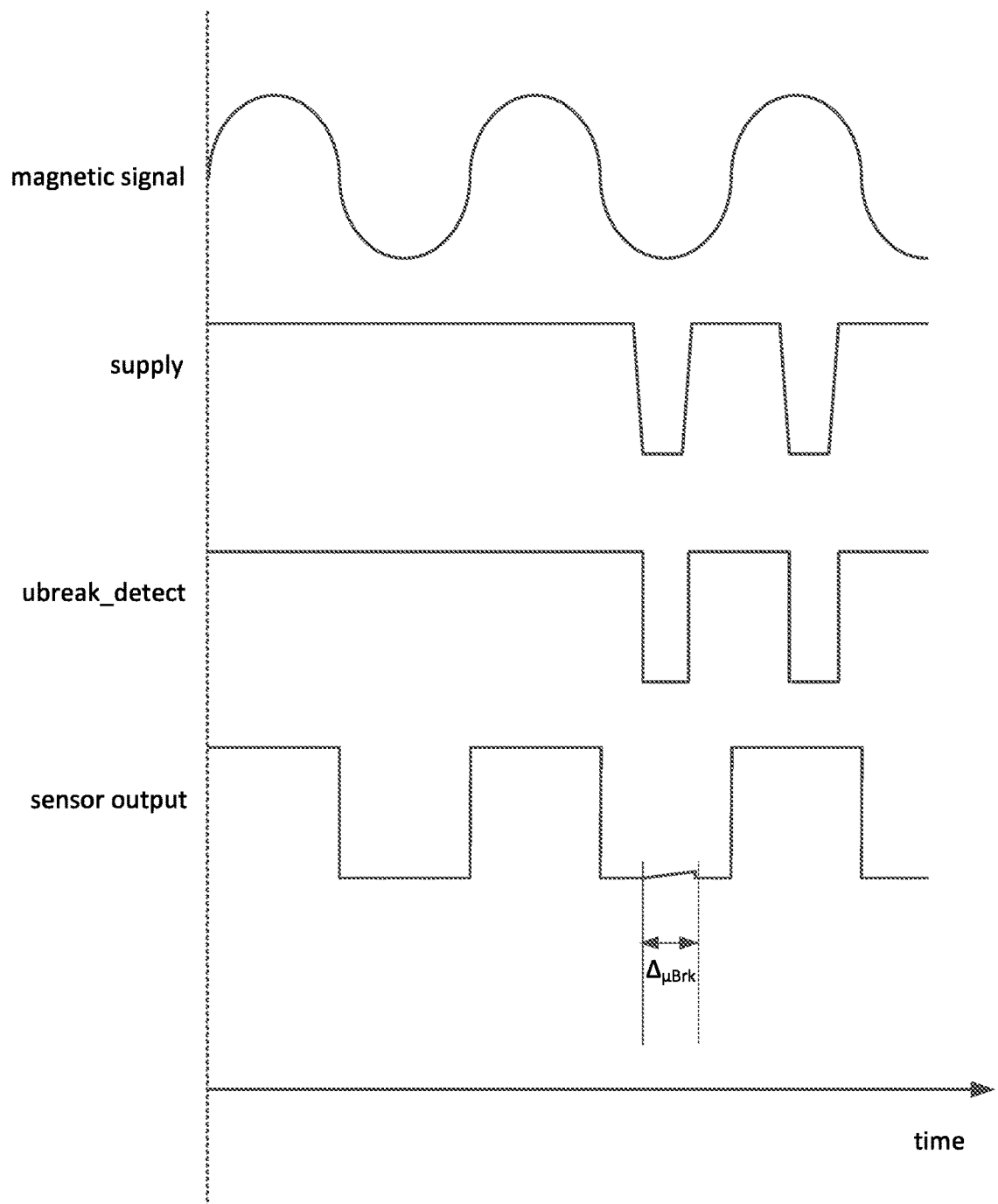
FIG. 2 illustrates a timing diagram for a freezing output state in accordance with aspects of the disclosure.

FIG. 2 illustrates a timing diagram 200 for a freezing output state in accordance with aspects of the disclosure.

The timing diagram shows a magnetic signal applied to a magnetic sensor, the supply voltage signal, the microbreak detect signal, and the output signal of the sensor. The output signal is based on the magnetic signal.

When the supply signal decreases due to an EMC disturbance (i.e., a microbreak), which is not related to the magnetic signal and the sensor output signal, the output circuit cannot provide signal processing. During this time the information at the output is maintained in the output transistor 110's inherent capacitor Cis. The sensor output signal (low or high) is frozen for the microbreak time. During the microbreak there is a slight increase in the sensor output signal is due to leakages. When the voltage supply signal subsequently goes high, the signal processing resumes.

Figure 3:
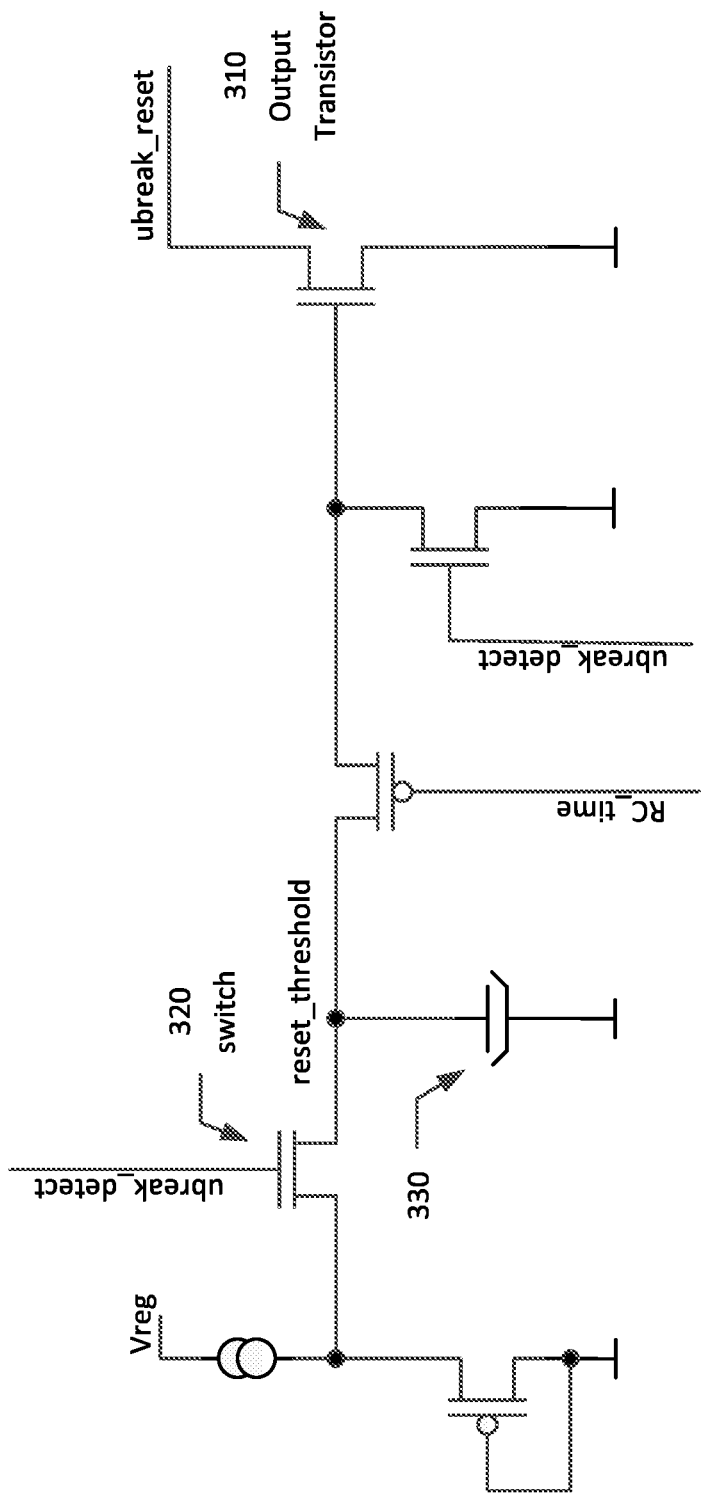
FIG. 3 illustrates a uBreak reset controller in accordance with aspects of the disclosure.

FIG. 3 illustrates a microbreak reset controller 300 in accordance with aspects of the disclosure. The microbreak reset controller 300 is the reset controller 170 of FIG. 1.

The exemplary reset controller 300 comprises a reset controller output transistor 310, a capacitor 330, and a charge switch 320, among other elements. The microbreak reset controller 300 is operational without a supply due to the capacitor 330 stores charge and then discharges to allow the reset controller 300 to operate for a period of time without the supply.

More specifically, the reset controller 300 ensures a constant reset time despite a temperature value. During normal operation (i.e., proper supply voltage), a PMOS threshold voltage level is stored on the capacitor 330 through the switch 320. The RC_time signal is high and the output transistor 310 of this circuitry is off.

When there is a decrease in supply voltage, the switch 320 turns off, decoupling the capacitor 330 from the circuitry shown to the left of the switch 320. The RC_time signal is provided by an RC circuitry (not shown), and the RC time constant defines a reliable reset time for the output transistor 310. When the RC_time signal toggles from high to low, the output transistor 310 is switched on by coupling its gate to the voltage stored on the capacitor 330, and the gate of the output transistor 310 is pulled up. As a consequence, the output state is reset to high.

This reset controller 300 is merely an example. The other elements are not germane to the disclosure and should be understood by one of ordinary skill. Their descriptions are therefore omitted here for the sake of brevity.

Figure 4:
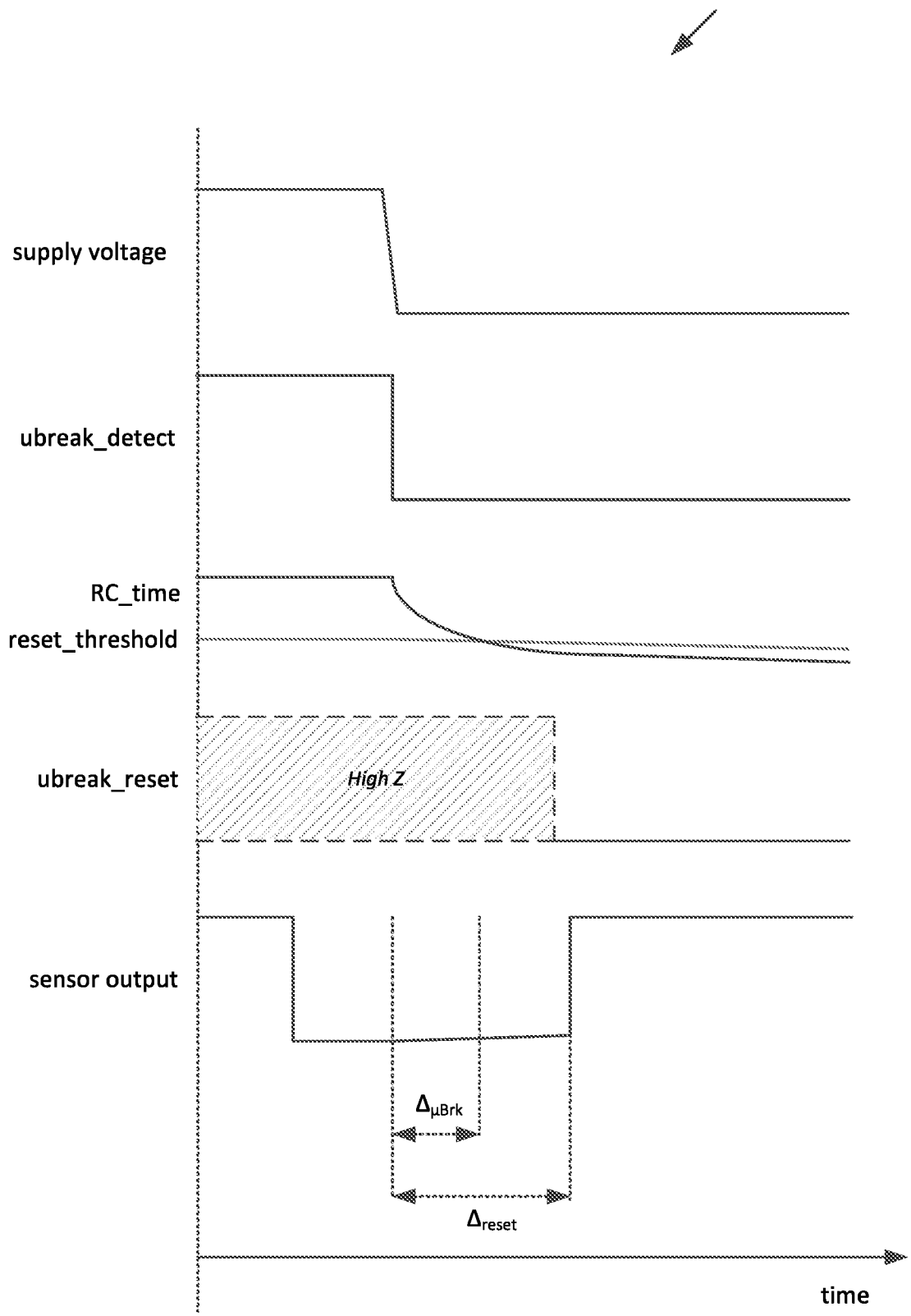
FIG. 4 illustrates a timing diagram for a predefined reset time in accordance with aspects of the disclosure.

FIG. 4 illustrates a timing diagram 400 for a predefined reset time in accordance with aspects of the disclosure.

The timing diagram 400 shows a supply voltage signal, a microbreak detect signal, an RC time signal, a reset threshold signal, a microbreak reset signal, and the sensor output signal.

When the supply comparator 10 detects a microbreak in the supply voltage, the microbreak detect signal from the supply comparator 10 goes low. The reset controller 170's microbreak reset signal goes to low after a predetermined time based on an RC time constant, that is, when the RC time signal becomes less than a reset threshold level. The chip reset circuit 60 then outputs a microbreak reset signal to cause the VDDL voltage of the charge pump 160 to short-circuit to low. The microbreak is indicated with dashed lines in the sensor output signal. After the reset time has elapsed and the microbreak reset signal goes to low, the sensor output signal is reset to high.

Figure 5:
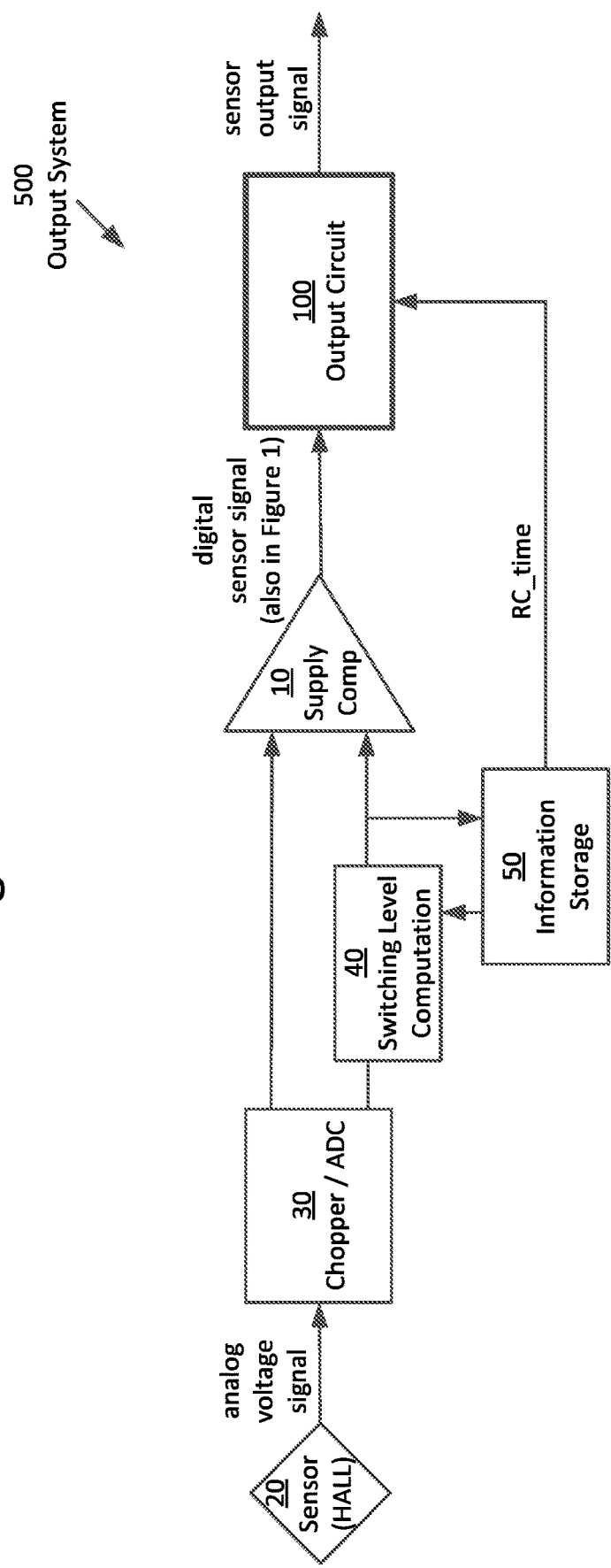
FIG. 5 illustrates an output system in accordance with aspects of the disclosure.

FIG. 5 illustrates an output system 500 in accordance with aspects of the disclosure.

The system 500 comprises a sensor 20 (e.g., Hall sensor), a chopper/analog-to-digital converter 30, a switching level computation circuit 40, the supply comparator 10 of FIG. 1, the output circuit 100 of FIG. 1, and an information storage 50 (i.e., memory).

The sensor 20 in this example is configured to output an analog voltage signal proportional with the magnetic field strength. The chopper/ADC 30 is configured to convert the analog signal to a digital signal. The supply comparator 10 is configured to compare the digital signal to a threshold provided by the switching level computation circuit 40 to determine whether the digital signal is at a high state or a low state.

The information storage 50 is configured to store digital information such as a threshold for the supply comparator 10, the RC time constant of the RC time signal, and the output state of the sensor 20, so that in case of a decrease in supply voltage or EMC disturbance, the output state of the sensor 20 is maintained. The information storage 50 is a memory that can be any well-known volatile and/or non-volatile memory.

FIG. 6 illustrates a flowchart 600 of a method in accordance with aspects of the disclosure.

In Step 610, providing, by an output transistor 110, an output signal.

In Step 620, decoupling, by a gate switch 130, a gate of the output transistor 110 from other components of an output circuit 100 when there is a decrease in a supply voltage of the output circuit 100. When the gate of the output transistor 110 is decoupled, a charge at the gate is maintained in a capacitor Cis inherent within the gate of the output transistor.

The subject matter of this disclosure is applicable not only to microbreaks, but also any disturbances when the supply voltage is near or below zero. When the supply voltage decreases, the state of the output signal should be maintained for a period of time.

The output circuit 100 of this disclosure ensures EMC robustness for the sensor output signal. Class A functionality is ensured by the proposed system while allowing a guaranteed reset time of the output. For this enhanced robustness there is no need to integrate area-consuming passive components.

Numerous other embodiments are also contemplated. These include embodiments that have fewer, additional, and/or different components, steps, features, objects, benefits and advantages. These also include embodiments in which the components and/or steps are arranged and/or ordered differently. For example, any signal discussed herein may be scaled, buffered, scaled and buffered, converted to another state (e.g., voltage, current, charge, time, etc.), or converted to another state (e.g., from HIGH to LOW and LOW to HIGH) without materially changing the underlying control method. Further, bipolar transistors (e.g., PNP or NPN) can be used instead of MOS transistors. A PNP may be used instead of NPN, and a PMOS may be used instead of NMOS.

For the purposes of this discussion, the terms "circuit" or "circuitry" shall be understood to be circuit(s), processor(s), logic, or a combination thereof. For example, a circuit can include an analog circuit, a digital circuit, state machine logic, other structural electronic hardware, or a combination thereof.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein.

What is claimed is:

1. An output circuit, comprising:
an output transistor configured to provide an output signal;
a gate switch configured to decouple a gate of the output transistor from other components of the output circuit when there is a decrease in a supply voltage of the output circuit,
wherein when the gate of the output transistor is decoupled, a charge at the gate is maintained in a capacitor inherent within the gate of the output transistor; and
a reset controller configured to reset the output signal after a predetermined reset time has elapsed after the gate switch decouples the gate of the output transistor.

2. An output circuit, comprising:
an output transistor configured to provide an output signal;
a gate switch configured to decouple a gate of the output transistor from other components of the output circuit when there is a decrease in a supply voltage of the output circuit,
wherein when the gate of the output transistor is decoupled, a charge at the gate is maintained in a capacitor inherent within the gate of the output transistor, and the output circuit is configured to receive a sensor signal and output the output signal.

3. The output circuit of claim 2, further comprising:
a charge pump configured to provide a local supply voltage for controlling the gate switch during a normal operation mode, wherein the local supply voltage is greater than the supply voltage.

4. The output circuit of claim 3, further comprising:
a chip reset circuit coupled to the output of the charge pump and configured to drive the charge pump output to ground during the decrease in the supply voltage.

5. The output circuit of claim 2, further comprising:
a reset controller configured to output a reset signal to pull down the gate of the output transistor after a predetermined reset time has elapsed.

6. The output circuit of claim 5, wherein the reset controller is configured to output the reset signal in response to receiving a resistor-capacitor (RC) time signal.

7. The output of claim 6, wherein the reset controller comprises:
reset controller output transistor configured to output the reset signal;
a capacitor configured to store a threshold voltage; and
a discharge switch configured to, in response to receiving the RC time signal, switch on to couple the capacitor to a gate of the reset controller output transistor.

8. A circuit, comprising:
the output circuit of claim 6; and
a memory configured to store an RC time constant provided by a resistor and a capacitor within the circuit.

9. The output circuit of claim 2, further comprising:
a passive pull-down circuit coupled to the gate switch, and configured to drive the gate switch to ground during the decrease in the supply voltage.

10. The output circuit of claim 2, further comprising:
a slope controller coupled between a signal input of the output circuit and the gate, and configured to current charge and discharge the gate.

11. The output circuit of claim 10, wherein the slope controller comprises:
a first current source coupled between a supply and the gate, and configured to current charge the gate when the signal input to the output circuit is high; and
a second current source coupled between ground and the gate, and configured to current discharge the gate when the signal input to the output circuit is low.

12. The output circuit of claim 2, further comprising:
a hard-on switch coupled between a regulated supply voltage and the gate, and configured to be closed when a signal input to the output circuit is high; and
a hard-off switch coupled between a ground and the gate, and configured to be closed when the signal input to the output circuit is low.

13. The output circuit of claim 2, further comprising:
a reverse protection transistor coupled between an output node of the output circuit and the output transistor, and configured to prevent a reverse current at the output node.

14. A method of operating an output circuit, the method comprising:
providing, by an output transistor, an output signal;
decoupling, by a gate switch, a gate of the output transistor from other components of the output circuit when there is a decrease in a supply voltage of the output circuit,
wherein when the gate of the output transistor is decoupled, a charge at the gate is maintained in a capacitor inherent within the gate of the output transistor; and
resetting, by a reset controller, the output signal after a predetermined reset time has elapsed after the decoupling of the gate of the output transistor.

15. The method of claim 14, further comprising:
providing, by a charge pump, a local supply voltage for controlling the gate switch during a normal operation mode, wherein the local supply voltage is greater than the supply voltage.

16. The method of claim 14, further comprising:
outputting, by a reset controller, a reset signal to pull down the gate of the output transistor after a predetermined reset time has elapsed.

17. The method of claim 14, further comprising:
driving, by a passive pull-down circuit coupled to the gate switch, the gate switch to ground during the decrease in the supply voltage.

18. The method of claim 14, further comprising:
current charging and discharging of the gate, by a slope controller coupled between a signal input of the output circuit and the gate.

* * * * *